POLY (VINYLACETATE-3-(4)-AZIDOPHTHALATE) PHOTORESIST

UNSENSITIZED

SENSITIZED WITH 4-OXO-4a-AZANAPHTHALENE

SENSITIZED WITH 4-THIO-4a-AZANAPHTHALENE

George A. Reynolds
Earl M. Robertson
James A. Van Allan
INVENTORS
BY R. Frank Smith
Ray Carter Livermore
ATTORNEY & AGENT

POLY(VINYL ACETATE-AZIDOBENZOATE) PHOTORESIST

UNSENSITIZED

SENSITIZED WITH 4-OXO-4a AZANAPHTHALENE

SENSITIZED WITH N-PHENYLTHIOACRIDONE

George A. Reynolds
Earl M. Robertson
James A. Van Allan
INVENTORS
BY R. Frank Smith
Roy Carter Livermore
ATTORNEY & AGENT

United States Patent Office 3,072,485
Patented Jan. 8, 1963

3,072,485

OPTICALLY SENSITIZED AZIDO POLYMERS FOR PHOTOMECHANICAL RESIST COMPOSITIONS

George A. Reynolds, Earl M. Robertson, and James A. Van Allan, Rochester, N.Y., assignors to Eastman Kodak Company, Rochester, N.Y., a corporation of New Jersey Filed Aug. 24, 1960, Ser. No. 51,695
20 Claims. (Cl. 96—115)

This invention relates to the optical sensitization of inherently light-sensitive polymers containing recurring units to which are attached azide groups and more particularly to the photo-sensitization of such polymers containing recurring aromatic azide groups attached to vinyl polymer chains.

It is well known to use light-sensitive polymers such as bichromated shellac, poly(vinyl cinnamate), and cinnamoylated poly(styrene) in photoresist applications wherein a resist image is formed to protect the surface of the support from attack by etching solvents, sand blast, or the like. Light-sensitive polymers are also used in photomechanical reproduction for forming resist images for the preparation of printing plates.

Light-sensitive azide polymers containing recurring aromatic azide groups are described in Merrill et al., U.S. patent applications, Serial Nos. 525,271 and 525,368, filed July 29, 1955. One of these, poly(vinyl acetate-3-(4)-azidophthalate), is a particularly efficacious polymer for making photoresist material for office copy work. Another, poly(vinyl acetate-azidobenzoate), is useful for making printed circuits. Upon exposure to an image, the light-sensitive polymer is locally insolubilized in those areas that are exposed to ultraviolet and short wave length visible light, while the areas that are not exposed to light remain soluble and are readily removed by swabbing with a suitable solvent.

Although the aromatic azide polymers are light-sensitive, they are generally optically sensitized when used in photoresist applications in order to reduce the required exposure. Optical sensitizers heretofore available have not increased the sensitivity of aromatic azide polymers as much as desired, nor have they increased the spectral range of sensitivity as much as desired.

Photosensitive polymeric systems used as photoresists are primarily sensitive to ultraviolet radiation and to the very short wave lengths of the visible spectrum. Increasing the sensitivity of such systems into the visible region of the spectrum has several advantages: It makes available inexpensive and convenient light sources such as incandescent lamps, it reduces overall exposure time, and allows projection printing through various optical systems.

It is therefore an object of our invention to provide optical sensitizers which will greatly enhance the light-sensitivity of polymers containing recurring aromatic azide groups.

Another object of our invention is to provide optical sensitizers that not only greatly enhance the sensitivity of polymers containing recurring aromatic azide groups but which extend the spectral range of sensitivity of these polymers, particularly to enable exposure by radiation of longer wave lengths.

Another object of our invention is to provide new and greatly improved photoresist materials in which our optical sensitizers are used to increase the sensitivity and extend the spectral range of sensitivity of the polymers used which contain recurring aromatic azide groups.

Other objects will become apparent from the following specification and claims.

We have discovered that these and other objects can be accomplished by optically sensitizing the aromatic azide polymers with compounds selected from those having the formulas:

(I)

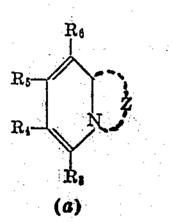

(a)

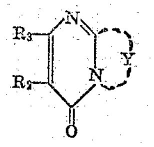

(b)

and

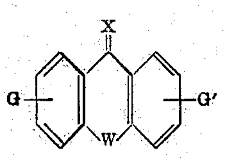

(c)

in which Z represents the nonmetallic atoms required to complete a 4-oxo-1,4a-diazanaphthalene nucleus, a 4-oxo-4a-azanaphthalene nucleus or a 4-thio-4a-azanaphthalene nucleus, $R_2$, $R_3$, $R_4$, $R_5$, and $R_6$ each represents a hydrogen atom, a lower alkyl group having from one to four carbon atoms such as methyl, ethyl, n-propyl, isopropyl, n-butyl, secondary butyl, tertiary butyl, etc., a carbalkoxy group such as carbomethoxy, carbethoxy, carbopropoxy, carbobutoxy, etc., a halogen atom such as a chlorine atom, a bromine atom, an iodine atom, etc., Y represents the nonmetallic atoms required to complete a 1-thia-3a,7-diazaindene nucleus, X represents a sulfur atom or an oxygen atom, W represents a =NQ group or a $=CH_2$ group, Q represents a hydrogen atom, an alkyl group having 1 to 4 carbon atoms such as methyl, ethyl, propyl, n-butyl, secondary butyl, tertiary butyl, etc., alkoxy in which the alkyl group has from 1 to 4 carbon atoms such as methoxy, ethoxy, propoxy, isopropoxy, n-butoxy, secondary butoxy, tertiary butoxy, etc., aryl such as phenyl, tolyl, anisyl, etc., aryloxy, such as phenoxy, etc., and G and G′ each represent a Q group or a fused carbocyclic ring such as a benzo group.

Among the compounds represented by Formulas I*a*, I*b*, and I*c* that we have found to be particularly efficacious sensitizers for polymers having recurring aromatic azide groups are the following:

(*a*) 4-oxo-1,4a-diazanaphthalenes having the formula (II)

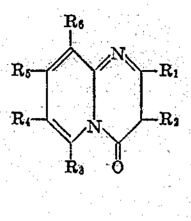

(*b*) 4a-azanaphthalenes having the formula (III)

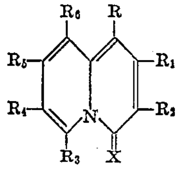

(*c*) 4-oxo-1-thia-3a,7-diazaindenes having the formula (IV)

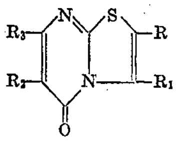

and (*d*) Acridones or thioacridones having the formula (V)

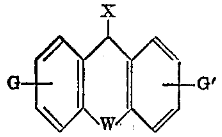

in which R, $R_1$, $R_2$, $R_3$, $R_4$, $R_5$, and $R_6$ each represents a hydrogen atom, a lower alkyl group having from one to four carbon atoms as defined above, a carbalkoxy group in which the alkoxy moiety has from one to four carbon atoms, such as carbomethoxy, carbethoxy, carbopropoxy, carbobutoxy, etc., a halogen atom such as a chlorine atom, a bromine atom, an iodine atom, etc., and X, W, G, and G′ are as defined above.

Our sensitizing agents are valuable for enhancing the sensitivity and extending the spectral range of sensitivity of film-forming, light-sensitive polymers having recurring aromatic azide groups. Among these azide polymers are those described in the above-mentioned Merrill et al. U.S. patent applications and in Rauner et al. U.S. patent application, Serial No. 18,745, filed March 30, 1960. Representative azide polymers illustrating those advantageously sensitized according to our invention are described as follows.

Light-sensitive film-forming azidostyrene homopolymers containing the following recurring structural unit:

(VI)

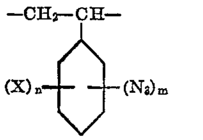

or copolymers of said azidostyrenes consisting of the following recurring structural units in random combination:

(VII)

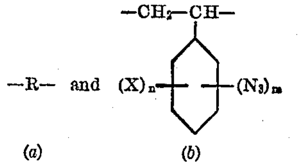

(*a*) (*b*)

wherein the ratio of VII(*a*) units to VII(*b*) units in each resin molecule can vary from 1:19 to 19:1, i.e., VII(*b*) are present from 5 to 95 mole percent, and wherein *m* represents in each instance a digit 1 or 2, *n* represents a digit of from 0 to 2, X represents a hydrogen atom, a chlorine atom, an alkyl group containing from 1 to 4 carbon atoms, e.g., methyl, ethyl, propyl, butyl, etc., an alkoxy group containing from 1 to 4 carbon atoms, e.g., methoxy, ethoxy, propoxy, butoxy, etc., and a nitro group, and R represents a unit such as ethylene, isobutylene, a 1,3-butadiene, styrene and substituted styrenes, etc., an $\alpha,\beta$-unsaturated mono- or di-carboxylic acid unit such as acrylic acid, an $\alpha$-alkylacrylic acid, maleic acid, citraconic acid, itaconic acid, etc., and the anhydrides, alkyl esters, imides, N-alkyl imides, nitriles, amides, and N-alkyl and N,N-dialkyl substituted amides of these acids, fumaric and mesaconic acids and their alkyl esters, nitriles, amides and N-alkyl and N,N-dialkyl substituted amides, vinyl alkyl ketones such as vinyl methyl ketone, vinyl halides, such as vinyl chloride, vinylidene halides, such as vinylidene chloride, and the like units, and wherein in each instance in the above the alkyl and alkoxy groups contain from 1 to 4 carbon atoms, by diazotizing a polyaminostyrene or a copolymer of aminostyrene and reacting the resulting diazonium salt with sodium azide, followed by separation of the azido derivative from the reaction mixture. The intermediate aminostyrene polymers can be prepared by nitrating the styrene nucleus of the appropriate styrene polymer and then reducing the nitro derivative to the corresponding amine derivative. Where R in the above structure VII is an $\alpha,\beta$-unsaturated di-carboxylic acid unit, e.g., a 1:1 copolymer of an azidostyrene and maleic acid, the copolymer can be treated with acetic anhydride to give the maleic anhydride derivative and this can then be reacted with a variety of hydroxyl- and amino-containing components, including hydroxylated azide-containing components which greatly increases the azide content of the polymer molecule, to give the corresponding ester and amide derivatives. In place of the maleic acid-azidostyrene copolymer, there can be employed citraconic or itaconic acid copolymers with the azidostyrene.

To obtain the film-forming, light-sensitive polymers of the invention, wherein the azido grouping is contained in an ester type side chain of the polymer, as in the azidobenzoates of vinyl alcohol polymers represented, for example, by the homopolymers consisting essentially of the following recurring structural unit:

(VIII)

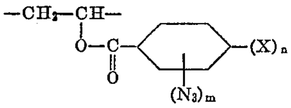

or by copolymers consisting essentially of the following recurring structural units in random combination:

(IX)

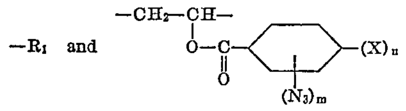

(*a*) (*b*)

wherein the ratio of IX(*a*) units to IX(*b*) in each resin molecule can vary from 1:19 to 19:1, and wherein *m*, *n* and X are as previously defined, and $R_1$ represents a unit such as ethylene, isobutylene, 1,3-butadiene, etc., a vinyl or isopropenyl carboxylic ester, ether, ketone, carbamate or acetal, and the like units, an o-, m- or p-azidobenzoyl chloride represented by the general formula:

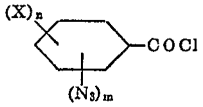

wherein *m*, *n* and X are as above defined, is condensed with a polyvinyl alcohol, a partially hydrolyzed polyvinyl or a polyisopropenyl ester, e.g., partially hydrolyzed polyvinyl acetate, polyvinyl butyrate, polyvinyl benzoate, polyvinyl carbamate, polyvinyl cinnamate, polyvinyl cyanoacetate, polyvinyl azidobenzoate, etc., or with a partially hydrolyzed copolymer of vinyl and isopropenyl esters, or with partial alkyl ethers of polyvinyl alcohol, or with partial polyvinyl acetals. The free hydroxyl groups in each instance can be partially or substantially completely esterified, as desired, with the azidobenzoyl chloride reactant. Where the esterification of a partially hydrolyzed polyvinyl acetate with azidobenzoyl chloride is incomplete, the final light-sensitive polymer product may contain more than two different units making up the structure such as vinylazidobenzoate units, vinyl acetate units and vinyl alcohol units.

In place of azidobenzoyl chloride, there may be employed an azidonaphthoyl chloride, azidophenylacyl chlorides, such as o-, m- or p-azidophenylacetyl chloride, etc., an azidocinnamoyl chloride, and the like, to give the corresponding polymeric derivatives of the above-mentioned hydroxyl-containing polymers. The mentioned azido-group-containing acid chlorides are also capable of condensing with other hydroxylic polymeric materials, for example, with naturally occurring materials such as cellulose, starch, guar, alginic acid or with their partially esterified or etherified derivatives to give other operable light-sensitive polymers. The said acid chlorides are capable of condensing also with polymeric materials containing amino groups having free hydrogen atoms, for example, with synthetic polymers such as polyvinylamine, polyvinyl anthranilate, polymeric amino-triazoles, etc., as well as with naturally occurring polymers, such as gelatin, to give the corresponding light-sensitive amide derivatives.

To obtain the film-forming, light-sensitive polymers of the invention wherein the azido grouping is contained in a different ester type of side chain of the polymers, as in the azidophthalates of vinyl alcohol polymers represented, for example, by homopolymers consisting essentially of the following recurring structural unit:

(X)

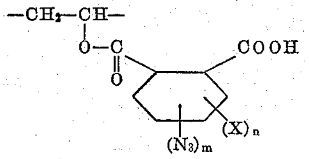

or by copolymers consisting essentially of the following recurring structural units in random combination:

(XI)

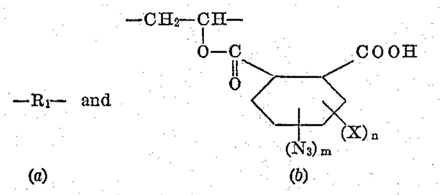

wherein the ratio of XI(*a*) units to XI(*b*) units in each resin molecule can vary from 1:19 to 19:1, and wherein *m, n,* X and $R_1$ are as previously defined, an o-, m- or p-azidophthalic anhydride is condensed with a hydroxylic polymer such as mentioned in the process for preparing the light-sensitive polymers of structures VIII and IX. The azidophthalic anhydride can be substituted by various azidonaphthalic anhydrides. Also, the azidophthalic and azidonaphthalic anhydrides may be condensed with amino-group-containing synthetic polymers such as polyvinylamines, polyvinyl anthranilates, polymeric aminotriazoles, etc., and proteins, such as gelatin, casein, etc., to give the corresponding light-sensitive amide derivatives.

To obtain the film-forming, light-sensitive polymers of the invention wherein the azido grouping is contained in a still different ester type of side chain of the polymer as in the esters of azidophenylalkanols with maleic anhydride copolymers consisting essentially of the following recurring structural unit:

(XII)

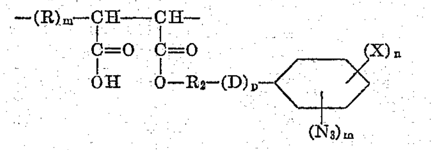

wherein *m, n,* X and R are as previously defined, $R_2$ represents an alkylene group containing from 1 to 4 carbon atoms such as —$CH_2$—, —$CH_2CH_2$—, etc., D represents an atom of oxygen, an atom of sulfur, an amino group or an alkylimino group and *p* represents a digit 0 or 1, a hydroxylated azido-group-containing compound, such as an o-, m- or p-azidophenylalkanol, such as represented by the general formula:

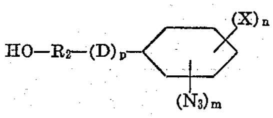

wherein *m, n,* X, $R_2$, D and *p* are as previously defined, is condensed with a maleic anhydride copolymer, preferably with a 1:1 styrene-maleic anhydride copolymer. As typical azidobenzylalkanols, there may be employed, for example, p-azidobenzyl alcohol, o-azidobenzyl alcohol, m-azidobenzyl alcohol, 2-(azidophenyl)ethanol, an azidophenoxyethanol, an aliphatic hydroxylated azido compound, such as 2-azidoethanol or 2-azido-2-phenylethanol to give the corresponding light-sensitive esters. Also, the maleic anhydride copolymer can be replaced by polyacrylic or polymethacrylic anhydrides to give generally similar light-sensitive polymers with the said hydroxylated azido group containing compounds.

To obtain the film-forming, light-sensitive polymers of the invention wherein the azido grouping is contained in an acetal group attached to a polymer chain, as in polyvinyl azidobenzalacetals consisting essentially of the following recurring structural unit:

(XIII)

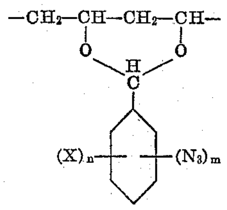

wherein *m, n* and X are as previously defined, a polyvinyl alcohol or a carboxylic ester thereof such as polyvinyl acetate, polyvinyl butyrate, etc., is condensed, in the presence of an acid catalyst with an azidobenzaldehyde represented by the general formula:

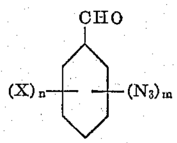

wherein *m, n* and X are as previously defined. The intermediate azidobenzaldehydes can be prepared, in general, by the method described by M. O. Forster and H. M. Judd, J. Chem. Soc. 97, page 254 (1910), wherein an aminobenzaldehyde is diazotized and then treated with sodium azide to give the corresponding azidobenzaldehyde. Where the polyvinyl alcohol is only partly acetalized, the final light-sensitive polymeric product will also contain some unreacted hydroxyl groups and, in the case where a polyvinyl ester is employed as the initial polymeric material and is only partially acetalized, the final light-sensitive polymer may contain both acetal and ester groups. It is also within the invention to employ partially hydrolyzed polyvinyl esters and to only partially acetalize the available hydroxyl groups. The above-described light-sensitive polymeric products containing residual or unreacted hydroxyl groups can advantageously be further modified by acylation with acid chlorides or anhydrides or by carbamylation with isocyanates. For instance, a partial polyvinyl azidobenzalacetal may be acetylated, maleylated, succinoylated, phthaloylated, benzoylated, cinnamoylated, etc.

Among the sensitizers of our invention are the representative examples tabulated below in Table I. Sensitizers 1 through 9 illustrate those of Formula II, Sensitizers 10 through 15 illustrate those represented by Formula III, Sensitizers 16 through 21 illustrate those represented by Formula IV, and Sensitizers 22 through 46 illustrate those represented by Formula V.

TABLE I

*Sensitizer*

| Number | Name |
|---|---|
| 1 | 3-carbethoxy-6-chloro-4-oxo-1,4a-diazanaphthalene. |
| 2 | 3-carbethoxy-7-methyl-4-oxo-1,4a-diazanaphthalene. |
| 3 | 3-carbethoxy-8-methyl-4-oxo-1,4a-diazanaphthalene. |
| 4 | 3-carbethoxy-6-methyl-4-oxo-1,4a-diazanaphthalene. |
| 5 | 6-bromo-3-carbethoxy-4-oxo-1,4a-diazanaphthalene. |
| 6 | 3-carbethoxy-4-oxo-1,4a-diazanaphthalene. |
| 7 | 3-carbethoxy-6-iodo-4-oxo-1,4a-diazanaphthalene. |
| 8 | 3-carbethoxy-6,8-dibromo-4-oxo-1,4a-diazanaphthalene. |
| 9 | 2-methyl-4-oxo-1,4a-diazanaphthalene. |
| 10 | 4-oxo-4a-azanaphthalene. |
| 11 | 6-ethyl-4-oxo-4a-azanaphthalene. |
| 12 | 1-carbethoxy-4-oxo-4a-azanaphthalene. |
| 13 | 3-carbethoxy-4-oxo-4a-azanaphthalene. |
| 14 | 1,3-dicarbethoxy-4-oxo-4a-azanaphthalene. |
| 15 | 4-thio-4a-azanaphthalene. |
| 16 | 5-carbethoxy-3-methyl-4-oxo-1-thia-3a,7-diazaindene. |
| 17 | 2,5-bis(carbethoxy)-3-methyl-4-oxo-1-thia-3a,7-diazaindene. |
| 18 | 3-carbethoxy-4-oxo-1-thia-3a,7-diazaindene. |
| 19 | 5-carbethoxy-2-chloro-4-oxo-1-thia-3a,7-diazaindene. |
| 20 | 3,6-dimethyl-4-oxo-1-thia-3a,7-diazaindene. |
| 21 | 4-oxo-1-thia-3a,7-diazaindene. |
| 22 | N-methylacridone. |
| 23 | 1,4,8-trichloroacridone. |
| 24 | N-2-quinolylacridone. |
| 25 | Acridone. |
| 26 | 2,6-dichloroacridone. |
| 27 | 3-nitro-N-methylacridone. |
| 28 | N-phenylacridone. |
| 29 | 6-chloro-2-methoxy-10-phenylacridone. |
| 30 | 6-chloro-2-methoxy-10-methylacridone. |
| 31 | 1,2-benzacridone. |
| 32 | 3-nitroacridone. |
| 33 | 6-chloro-2-methoxy-10-methylthioacridone. |
| 34 | N-phenylthioacridone. |
| 35 | 3-methoxy-10-methyl-9-thioacridone. |
| 36 | 1-ethoxythioacridone. |
| 37 | 2-ethoxythioacridone. |
| 38 | N-o-tolylthioacridone. |
| 39 | 1,2-benzthioacridone. |
| 40 | N-p-aminophenylthioacridone. |
| 41 | N-methylthioacridone. |
| 42 | 4-ethoxythioacridone. |
| 43 | Thioacridone. |
| 44 | 3,7-dichloroacrid ne. |
| 45 | 6-chloro-2-ethoxythioacridone. |
| 46 | 5-oxo-5a,10-diazanthracene. |

In using our sensitizers to enhance the sensitivity and spectral range of sensitivity of inherently light-sensitive polymeric material having recurring aromatic azide groups, the sensitizer is added to the polymer dope, that is, a solution of the polymer in a suitable solvent. When the polymer has free carboxyl groups as poly(vinyl acetate-3-(4)-azidophthalate) does, the dope may comprise an alkaline aqueous medium such as a dilute solution of ammonium hydroxide or sodium carbonate. Sometimes certain sensitizers are not easily soluble in aqueous media. In those instances, the dope solvent chosen is an organic solvent such as methyl Cellosolve acetate solvent, acetone, 2-butanone, cyclohexanone, etc., or mixtures of these solvents in which both sensitizer and polymer are soluble. Polymers such as poly(vinyl acetate-azidobenzoate), acetals of partially acetylated poly(vinyl alcohol) and p-azidobenzaldehyde, and azide-bearing esters produced by treating poly(styrene-maleic anhydride) with 4-($\beta$-hydroxyethyl)phenyl azide do not have free carboxyl groups so organic solvents such as those listed above are used exclusively to prepare the polymer dope and to dissolve the sensitizer.

The following representative examples will illustrate more specifically how our sensitizers are used according to our invention.

EXAMPLE I

A sensitized azide polymer dope was prepared having the following composition.

2.0 ml. of 28 percent ammonium hydroxide
98.0 ml. of distilled water
0.75 g. of poly(vinyl acetate-3-(4)-azidophthalate)
0.075 g. of 4-oxo-4a-azanaphthalene, Sensitizer 10

This dope was whirl-coated horizontally at 75 revolutions per minute on a silicated grained aluminum sheet that had been wet with water just before coating. After drying, this coating was exposed for 75 units (about 2.5 minutes) to a 95-ampere carbon arc light at a distance of four feet through a silver step tablet wedge. The exposed coating was then wash-off developed for 40 seconds in 0.5 percent ammonium hydroxide solution, rinsed for 20 seconds in fresh 0.5 percent ammonium hydroxide solution, and dyed while the resist image consisting of insolubilized polymer was swollen with developer, by immersion in a tank containing a solution of 1 percent methyl violet in about 95 percent ethyl alcohol for 10 seconds.

An unsensitized control coating of poly(vinyl cinnamate) was exposed under the same conditions used above, then wash-off developed in a tray of 2-butanone for 2 minutes, followed by a rinse in a fresh portion of the developer. The swollen insolubilized image was dyed with the methyl violet solution used above.

A relative speed value of 1400 was calculated for poly(vinyl acetate-3-(4)-azidophthalate) sensitized with Sensitizer 10 based on a comparison of the number of visible steps comprising the dyed image with the visible steps of dyed image produced in the unsensitized poly(vinyl cinnamate) coating. Thus our photoresist material required only 1/1400 of the incident energy required by the unsensitized poly(vinyl cinnamate) coating to insolubilize the same exposure index step.

The relative speed was determined for a coating of poly(vinyl acetate-3-(4)-azidophthalate) prepared as above but which contained no optical sensitizer. This unsensitized photoresist material had a relative speed of 45.

EXAMPLE II

Sensitizers 11 and 15 were tested as in Example I and were found to give relative speeds of 1400 and 550, respectively.

The following example will illustrate how organic solvents are used to advantage in preparing and testing a poly(vinyl acetate-3-(4)-azidophthalate) dope sensitized with an acridone sensitizer.

EXAMPLE III

A sensitized azide polymer dope was prepared having the following composition.

19.6 g. of cyclohexanone
78.2 g. of 2-butanone
2.0 g. of poly(vinyl acetate-3-(4)-azidophthalate)
0.02 g. of N-phenylacridone, Sensitizer 28

This dope was whirl-coated horizontally at 75 revolutions per minute on a silicated grained aluminum sheet. After drying, this coating was exposed for 60 units (about 2.0 minutes) to a 95-ampere carbon arc light at a distance of four feet through a silver step tablet wedge. The exposed coating was then wash-off developed for 40 seconds in 0.5 percent ammonium hydroxide solution, rinsed for 20 seconds in fresh 0.5 percent ammonium hydroxide solution, and dyed while the resist image consisting of insolubilized polymer was swollen with developer, by immersion in a tank containing a solution of 1 percent methyl violet in about 95 percent ethyl alcohol for 10 seconds.

An unsensitized control coating of poly(vinyl cinnamate) was exposed under the same conditions used above, then wash-off developed in a tray of 2-butanone for 2 minutes, followed by a rinse in a fresh portion of the developer. The swollen insolubilized image was dyed with the methyl violet solution used above.

A relative speed value of 180 was calculated for poly(vinyl acetate-3-(4)-azidophthalate) sensitized with N-phenylacridone based on a comparison of the number of visible steps comprising the dyed image with the visible steps of dyed image produced in the unsentized poly(vinyl cinnamate) coating. Thus our photoresist material required only 1/180 of the incident energy required by the unsensitized poly(vinyl cinnamate) coating to insolubilize the same exposure index step.

The relative speed was determined for a coating of poly(vinyl acetate-3-(4)-azidophthalate) prepared as above but which contained no optical sensitizer. This photoresist material had a relative speed of 10.

EXAMPLE IV

Three sensitized photoresist materials were prepared as in Example III but using separately Sensitizers 34, 35, 36, and 45 in place of Sensitizer 28. The relative speeds determined are listed in Table II.

EXAMPLE V

A sensitized azide polymer dope was prepared having the following composition.

100 ml. of cyclohexanone
2 g. of poly(vinyl acetate-p-azidobenzoate)
.20 g. of 4-oxo-4a-azanaphthalene, Sensitizer 10

This dope was whirl-coated at 78 revolutions per minute on a silicated grained aluminum sheet. After drying, the coating was exposed as in Example I and the unexposed areas of the exposed coating were wash-off developed in cyclohexanone using a two-minute development and a one-minute rinse. The insolubilized but swollen polymer was then dyed by immersion in the 1 percent methyl violet as in Example I. A relative speed of 2000 was determined for this photoresist material by comparing it to an unsensitized control coating of poly(vinyl cinnamate) as described in Example I.

Dope prepared as above in Example V but containing no sensitizer was found to have a relative speed of 55.

EXAMPLE VI

Photoresist coatings were made as in Example V but sensitized with Sensitizers 11, 15, 28, 34, 35, 36, 44, and 46 in place of Sensitizer 10. Each coating had a single sensitizer. In each instance a large increase in sensitivity was found as may be seen from Table II where the data are tabulated.

EXAMPLE VII

A photoresist coating having the composition:

100 ml. cyclohexanone
2 g. acetal of partially acetylated poly(vinyl alcohol) and p-azidobenzaldehyde
0.2 g. 4-oxo-4a-azanaphthalene, Sensitizer 10 was made and tested as in Example V. A relative speed of 600 was found for this material by comparing it to an unsensitized control coating of poly(vinyl cinnamate) as described in Example I.

Dope prepared as above in Example VII but unsensitized was found to have a relative speed of 4.

Sensitizers 28, 35, 36, 44, and 45 were tested in place of Sensitizer 10 in Example VII and in each instance produced a large increase in speed as may be seen from Table II.

EXAMPLE VIII

Similarly, photoresist coatings were made of dope having the composition:

100 ml. cyclohexanone
2 g. azide ester produced by treating poly(styrenemaleic anhydride) with 4-($\beta$-hydroxyethyl)-phenyl azide
0.2 g. sensitizer Sensitizers 10, 28, 34, 36, and 45 were each tested to determine the relative speeds of photoresist materials containing them by the method used in Example V. In each instance large increases in relative speed were shown over the relative speed found for unsensitized polymer dope coatings.

The speed values for the photoresist coatings of Examples I through VIII are summarized in Table II.

TABLE II

| Sensitizer | Relative speed of sensitized and unsensitized polymer | | | | | | | | | | |
|---|---|---|---|---|---|---|---|---|---|---|---|
| | None | 10 | 11 | 15 | 28 | 34 | 35 | 36 | 44 | 45 | 46 |
| POLYMERIC AZIDE | | | | | | | | | | | |
| Poly(vinyl acetate-3-(4)-azidophthalate) | 45 | 1,400 | 1,400 | 550 | ------ | ------ | ------ | ------ | ------ | ------ | ------ |
| Do | 10 | ------ | ------ | ------ | 180 | 79 | ------ | ------ | ------ | ------ | ------ |
| Poly(vinyl acetate-p-azidobenzoate) | 55 | 2,000 | 450 | 2,500 | 1,000 | 1,300 | 1,000 | 700 | 280 | ------ | 1,600 |
| Acetal of partially acetylated poly(vinyl alcohol) and p-azido-benzaldehyde | 4 | 600 | ------ | ------ | 415 | ------ | 185 | 165 | 120 | 130 | ------ |
| Azide-bearing ester produced by treating poly(styrene-maleic anhydride) with 4-($\beta$-hydroxyethyl)phenyl azide | 56 | 562 | ------ | ------ | 447 | 501 | ------ | 178 | ------ | 355 | ------ |

EXAMPLE IX

Relative speeds tabulated in Table III to follow were determined as in Example I for photoresist materials containing Sensitizers 1 through 21. Sensitizers 5, 7, 8, 12, and 19 were not completely soluble in the ammonium hydroxide solution of the polymer. Methanol was added dropwise to these (up to two ml. of alcohol to 20 ml. of the polymer solution) to effect dissolution. Sensitizer that was not dissolved after this treatment was filtered from the solution before coating.

Relative speeds tabulated in Table IV to follow were determined as in Example V for photoresist materials containing Sensitizers 22 through 46.

Each of the photoresist materials tested above shows that our sensitizers produce large increases in the sensitivity of the polymer to the exposing light. For example, some of these sensitized photoresist materials have speeds that are 30 times the speed of the corresponding unsensitized material, and up to 1600 times the speed of unsensitized poly(vinyl cinnamate).

TABLE III

*Photographic Properties of Sensitized and Unsensitized Poly(Vinyl Acetate-3-(4)-Azidophthalate)*

| Sensitizer | Relative speed | Spectrogram | |
|---|---|---|---|
| | | Peak, mμ | Range, mμ |
| None | 45 | 310 | 270-360 |
| 1 | 1,100 | 310, 370 | 270-400 |
| 2 | 800 | 360 | 260-390 |
| 3 | 800 | 310, 370 | 260-390 |
| 4 | 800 | 310, 370 | 260-400 |
| 5 | 550 | 310, 370 | 260-400 |
| 6 | 550 | 310, 365 | 270-390 |
| 7 | 200 | 310, 370 | 260-400 |
| 8 | 140 | 310 | 250-410 |
| 9 | 100 | 310 | 260-390 |
| 10 | 1,400 | 320, 390 | 260-430 |
| 11 | 1,400 | 320, 390 | 260-430 |
| 12 | 1,100 | 320, 382 | 250-430 |
| 13 | 1,000 | 320, 400 | 260-450 |
| 14 | 650 | 320, 410 | 250-430 |
| 15 | 550 | 320, 410 | 260-460 |
| 16 | 550 | 310, 365 | 260-390 |
| 17 | 550 | 310, 370 | 270-390 |
| 18 | 200 | ------ | ------ |
| 19 | 200 | 310, 350 | 260-380 |
| 20 | 100 | 330 | 260-370 |
| 21 | 90 | 330 | 260-370 |

Our sensitizers are not only valubale because they greatly enhance the sensitivity of photoresist materials containing them but because they are characterized by substantially extending the photoresists' spectral range of sensitivity so that light of longer wave lengths can be used to expose them. This makes our photoresists particularly valuable because cheaper and more convenient light sources such as incandescent lights can be used for exposure instead of the arc lights now required. Furthermore, our photoresists can be exposed by projection with various optical systems so the original subject can be enlarged or reduced in size.

EXAMPLE X

A strip 35 mm. wide was cut from the original unexposed coating prepared in Example I. This was exposed for five minutes through a two mm. slit aperture in a spectrograph provided with a high intensity continuous spectrum light source. After exposure, the strip was wash-off developed and dyed as in Example I. Two sensitivity peaks were shown by the dyed spectrogram, one at 320 mμ and one at 390 mμ. The range of sensitivity was from 260 to 430 mμ. This range was 80 mμ greater than the range of 270 to 360 mμ determined for the unsensitized polymer.

TABLE V

*Spectral Sensitivity of Sensitized and Unsensitized Photoresist Materials Using the Polymer and Sensitizer Indicated*

| Sensitizer | Poly(vinyl acetate-3-(4)-azidophthalate) | | Poly(vinyl acetate-azidobenzoate) | | Acetals of partially acetylated poly(vinyl alcohol) and p-azidobenzaldehyde | | Azide-bearing ester produced by treating poly(styrene-maleic anhydride) with 4-(β-hydroxyethyl)-phenyl azide | |
|---|---|---|---|---|---|---|---|---|
| | Peak, mμ | Range, mμ | Peak, mμ | Range, mμ | Peak, mμ | Range, mμ | Peak, mμ | Range, mμ |
| None | 310 | 270–360 | 310 | 280–380 | No image | No image | 300, 340 | 260–380 |
| 10 | 320, 390 | 260–430 | 310, 410 | 290–440 | 310, 400 | 280–440 | 300, 390 | 270–430 |
| 11 | 320, 390 | 260, 430 | 300, 400 | 270–430 | | | | |
| 15 | 320, 410 | 260–460 | 310, 400, 460 | 280–480 | | | | |
| 28 | 320, 400 | 290–430 | 310, 400 | 280–430 | 420 | 280–425 | 300, 410 | 270–430 |
| 31 | 320, 410 | 270–430 | | | | | 300, 410 | 270, 430 |
| 35 | | | 300, 370, 490 | 270–520 | 470, 500 | 400–505 | | |
| 36 | | | 310, 400, 490 | 280–530 | 400 | 310–430 | 400 | 350–430 |
| 44 | | | 300, 500 | 280–520 | 330, 470, 500 | 320–510 | | |
| 45 | | | | | 340, 420, 460, 500 | 310–530 | 300, 340 | 270–500 |
| 46 | | | 300, 380 | 280–425 | | | | |

TABLE IV

*Photographic Properties of Sensitized and Unsensitized Poly(Vinyl Acetate-Azidobenzoate)*

| Sensitizer | Relative speed | Spectrogram | |
|---|---|---|---|
| | | Peak, mμ | Range, mμ |
| None | 55 | 310 | 280–380 |
| 22 | 1,400 | 300, 410 | 280–450 |
| 23 | 1,400 | 300, 410 | 270–430 |
| 24 | 1,300 | 300, 400 | 280–420 |
| 25 | 1,000 | 310, 400 | 280–430 |
| 26 | 1,000 | 300, 410 | 280–420 |
| 27 | 1,000 | 300, 400 | 270–460 |
| 28 | 1,000 | 310, 400 | 280–430 |
| 29 | 1,000 | 300, 420, 510 | 280–540 |
| 30 | 900 | 320, 430 | 280–460 |
| 31 | 500 | 300, 400 | 280–420 |
| 32 | 500 | 300, 400 | 280–450 |
| 33 | 1,400 | 310, 480, 520 | 280–590 |
| 34 | 1,300 | 300, 500 | 270–520 |
| 35 | 1,000 | 300, 370, 490 | 270–520 |
| 36 | 700 | 310, 400, 490 | 280–530 |
| 37 | 450 | 310, 500 | 280–550 |
| 38 | 700 | 300, 330, 500 | 270–520 |
| 39 | 500 | 340, 480 | 280–500 |
| 40 | 500 | 330, 410, 490 | 270–510 |
| 41 | 500 | 310, 490 | 280–540 |
| 42 | 700 | 310, 400, 490 | 280–530 |
| 43 | 450 | 310, 490 | 280–540 |
| 44 | 280 | 300, 500 | 280–520 |
| 45 | 350 | 310, 500 | 280–580 |
| 46 | 1,600 | 300, 380 | 280–425 |

Spectral sensitivity data from spectrograms made for each of our photoresist coatings made in Examples I through IX are included in Tables III, IV, and V. These data include the wave length or wave lengths of exposing radiation in mμ to which maximum sensitivity was shown as well as the range of sensitivity. In each instance the sensitivity peak is shifted to longer wave lengths, in some cases as high as 520 mμ from the 310 mμ usually observed for unsensitized material. The range of sensitivity has been increased from 270 to 360 mμ to as high as 270 to 590 mμ.

The following example illustrates the method used to obtain the spectral sensitivity data.

Although the speed and spectral sensitivity data illustrating our invention were determined for the sensitizer at a concentration equal to ten percent by weight of the polymer present, the sensitizers can be used at various concentrations up to their solubility limit (which might be less than 10 percent by weight). The optimum concentration for a given sensitizer is determined by making a concentration series such as is illustrated by the following example. In general, a concentration of from about 0.5 to 25 percent can be used.

EXAMPLE XI

Two coatings were made and tested as in Example I but using Sensitizer 10 at a concentration of five percent and twenty percent by weight of the polymer present. The relative speeds and spectral sensitivity data obtained in Examples I, X, and XI are given in Table VI.

TABLE VI

| Concentration of Sensitizer 10 in percent by weight of polymer | Relative speed | Spectral sensitivity | |
|---|---|---|---|
| | | Peaks in mμ | Range in mμ |
| 5 | 1,100 | 320, 390 | 260–430 |
| 10 | 1,400 | 320, 390 | 260–430 |
| 20 | 2,200 | 320, 390 | 260–440 |

Although the examples illustrating the invention show sensitizers used singly, two or more of our sensitizers may be used together to sensitize light-sensitive polymers having recurring aromatic azide groups. Also our sensitizers can be used in combination with any of the prior art sensitizers that are used to optically sensitize these polymers.

Exposed photoresist materials of our invention that contain polymers with unsubstituted carboxyl groups are wash-off developed in dilute water solutions of inorganic bases, for example, an alkali metal carbonate such as sodium carbonate, potassium carbonate, etc., and organic bases such as piperidine, etc. Water solutions containing 2 percent piperidine, 0.5 percent ammonium hydroxide or from 0.25 to 1.5 percent sodium carbonate are used advantageously. We have found that distilled water containing 0.5 percent sodium carbonate and 2 ml. of a photographic wetting agent such as Kodak Photo-Flo wetting agent is a preferred developer.

Our photoresist materials that contain polymers with no unsubstituted carboxyl groups are advantageously wash-off developed with any of the organic solvents or their mixtures previously described as useful in making the polymer dopes.

Various materials are used for the photoresist supports. In some cases a suitable degree of adhesion of the unexposed coating and the resultant resist image is facilitated by a physical or chemical treatment of the support, e.g., cleaning, chemical etching, abrasive grinding, subbing, and the like. For example, paper stock subbed with such materials as surface-hydrolyzed cellulose esters, poly(vinyl alcohol), etc., ceramic material such as porcelain, etc., glass, metal such as grained zinc, grained aluminum, chemically etched copper, chromium, copper adhered to Bakelite plastic support for printed circuits, aluminum plates coated with surface-hydrolyzed cellulose esters, poly(vinyl alcohol) cellulose esters, etc.

EXAMPLE XII

The following example illustrates the use of the translucent pigment, aluminum stearate, in a light-sensitive azide polymer composition where the composition was coated on a glass plate.

A solution was prepared by dissolving 7.0 grams of poly(vinyl acetate-p-azidobenzoate and 0.14 gram of N-phenylthioacridone in 100 ml. of N-butylacetate. To this solution 20 ml. of 20 percent aluminum stearate in xylene was added. The formulation was flow-coated on a clean glass support and allowed to dry in a near vertical position at room temperature. The sample was then exposed image-wise for one minute to a 35 amp. carbon arc at a 3-foot distance. Thereafter the plate was developed in a vapor degreaser using trichloroethylene. From the development it was noted that the plate showed an increase in photographic speed over a plate coated with unsensitized pigmented poly(vinyl acetate-p-azidobenzoate). The sample was thereafter subjected to 48 percent hydrofluoric acid etching bath. In the etching bath the pigmented sensitized sample etched to a depth of 0.003 to 0.006 inch.

Our sensitized photoresist materials can be used in the various ways disclosed in the mentioned Merrill et al. inventions to obtain photographic reproductions. In general, a layer of the sensitized polymer on a support is exposed under a pattern to render it locally insoluble. Then the insoluble relief image is developed on the support with a suitable solvent followed by other operations well known in the art such as etching the metal support through the resist image to provide a printing plate. Examples 1 to 19 of the Merrill et al. U.S. patent application, Serial No. 525,271, filed July 29, 1955, illustrate such usages and include the preparation of a lithographic printing plate, electrically conducting images, sand blast resist, and colored reproductions.

In addition to the sensitizing compounds of our invention described herein, we have found that the following compounds also increase the light sensitivity of the azide polymers.

1-cyano-3-carbethoxy-4-oxo-4a,9-diazafluorene
6,7′,8′ - trisulfo - p - phenylene - bis{2 - (1,2,3 - triazabenzo)[g]-indene} sodium salt
6,8,4′,7′ - tetrasulfo - p - phenylene - bis{2 - (1,2,3 - triazabenzo)[g]-indene} sodium salt
5-carbethoxy-3-methyl-4-oxo-1-thia-2,3a,7-thiazaindene
5-carbethoxy-2-ethyl-4-oxo-1-thia-3,3a,7-thiazaindene
4-dimethylamino-2-stilbazole
α-Stilbazolium methiodide 4′,4″ - bis(4 - sulfophenoxyacetamido) - p - terphenylbistriethanolamine salt
4′,4″ - bis(1,3 - bicarboxypropylureylene) - p - terphenyl sodium salt
4′,4″ - bis(ethoxysulfobenzamido)-p-terphenyl triethanolamine salt
4′,4″-bis(methoxysulfobenzamido)-p-terphenyl triethanolamine salt
3-aminophthalic acid
Sodium-3-aminophthalic acid Our invention is further illustrated by the following description of the preparation of our sensitizers.

The 1,4a-diazanaphthalenes, Sensitizers 1 through 8, were prepared by refluxing one-tenth molar quantities of 2-aminopyridine or its appropriate substitution product and ethyl ethoxymethylenemalonate in 50 ml. of trichlorobenzene until no further alcohol distilled. The reaction mixture was chilled, the precipitate filtered and crystallized from a suitable solvent. The yields were from 60 to 80 percent. This method is a modification of that described in J. Am. Chem. Soc., 70, 3349, and avoids isolating the intermediate anil. The following table lists the reactants from which the sensitizers were prepared, the melting points, and analytical data when available.

| Sensitizer | Prepared by reaction of ethoxymethylenemalonate with the following pyridine derivative | Melting point, ° C. | Analysis | | | | | |
|---|---|---|---|---|---|---|---|---|
| | | | Calculated | | | Found | | |
| | | | C | H | N | C | H | N |
| 1 | 2-amino-5-chloro | 133 | ------ | ------ | ------ | ------ | ------ | ---- |
| 2 | 2-amino-4-methyl | 162 | ------ | ------ | ------ | ------ | ------ | ---- |
| 3 | 2-amino-3-methyl | 150 | ------ | ------ | ------ | ------ | ------ | ---- |
| 4 | 2-amino-5-methyl | 136 | ------ | ------ | ------ | ------ | ------ | ---- |
| 5 | 2-amino-5-bromo | 132 | 44.4 | 3.0 | 9.4 | 44.3 | 3.1 | 9.3 |
| 6 | 2-amino | 111 | ------ | ------ | ------ | ------ | ------ | ---- |
| 7 | 2-amino-5-iodo | 105 | 38.4 | 2.6 | 8.1 | 38.4 | 2.6 | 8.0 |
| 8 | 2-amino-3,5-dibromo. | 145 | 35.1 | 2.1 | 7.4 | 35.2 | 2.4 | 7.2 |

Sensitizer 9 was prepared by a procedure described in J. Am. Chem. Soc., 74, 5493 (1952). It melted at 107° C.

Sensitizer 10 was prepared by the procedure described in J. Am. Chem. Soc., 73, 3683 (1951). The product was purified by recrystallization from a mixture of benzene and petroleum ether (rather than by sublimation) and melted at 73–74° C.

Sensitizer 11 was prepared by the procedure described in J. Am. Chem. Soc., 73, 3683 from 2-methyl-4-ethylpyridine and ethyl ethoxymethylene malonic ester. It had a melting point of 78° C.

| | C | H | N |
|---|---|---|---|
| Analysis: | | | |
| Calculated for $C_{11}H_{11}NO$ | 76.3 | 6.4 | 8.1 |
| Found | 76.4 | 6.6 | 8.2 |

Sensitizers 12 and 14 were prepared by the procedure described in J. Am. Chem. Soc., 73, 3681–4 (Chem. Abstracts, 46, 6649*a* (1952)), and Sensitizer 13 was prepared by a similar method.

Sensitizer 15 was prepared as follows. A mixture of 6.7 g. of 4-oxo-4a-azanaphthalene and 11 g. of phosphorus pentasulfide in 100 ml. of toluene was stirred at 60–80° C. for 30 minutes. An aqueous solution of ammonium sulfide was slowly added with heating and stirring until all of the solid was decomposed, and the toluene layer was separated, dried (magnesium sulfate) and the solvent removed. The residue was recrystallized from benzene plus a small amount of ligroin (B.P. 60–90° C.) to yield 5.3 g. of Sensitizer 15 a yellow solid with a melting point of 98–100° C.

*Analysis.*—Calculated for $C_9H_7NH$: S, 19.9. Found: S, 19.2.

Sensitizer 16 was prepared by the procedure described in J. Org. Chem., vol. 24, page 783 (1959). It had a melting point of 192° C.

| | C | H |
|---|---|---|
| Analysis: | | |
| Calculated for $C_{10}H_{10}N_2O_3S$ | 50.5 | 4.1 |
| Found | 51.8 | 5.1 |

Sensitizer 17 was prepared as follows. 2-amino-4-methyl-5-carbethoxythiazole (18.6 g.) and 22 ml. of ethyl ethoxymethylenemalonate in 70 ml. of trichlorobenzene were refluxed until no more alcohol distilled off. The solvent was removed in vacuo and the residue boiled in ligroin and cooled. The dark crystals were extracted three times with ligroin, (B.P. 90–120° C.), and then crystallized from benzene ligroin. A yield of 13 g. of Sensitizer 17 was obtained with a melting point of 90–91° C.

Sensitizer 18 was prepared by the method described in J. Org. Chem., vol. 24, page 783, IV. The sensitizer melted at 186° C.

| | C | H |
|---|---|---|
| Analysis: | | |
| Calculated for $C_9H_8N_2O_3S$ | 48.4 | 3.5 |
| Found | 48.3 | 3.5 |

Sensitizer 19 was prepared in a manner similar to that used for 18. It had a melting point of 149° C.

| | C | H |
|---|---|---|
| Analysis: | | |
| Calculated for $C_9H_8N_2O_3SCl$ | 41.8 | 2.7 |
| Found | 42.0 | 2.7 |

Sensitizer 20 was prepared by the method described in J. Org. Chem., vol. 24, page 783. It had a melting point of 134° C.

Sensitizer 21 was prepared by the method described in J. Org. Chem, vol. 24, page 783. It had a melting point of 116° C.

| | C | H |
|---|---|---|
| Analysis: | | |
| Calculated for $C_6H_4N_2SO$ | 47.3 | 2.6 |
| Found | 47.3 | 2.9 |

Sensitizers 22 through 24, 26, 27, 28, 31, 32, 34, 41, and 43 through 46 were prepared as described in the literature references listed below and had the melting points given.

| Sensitizer | Melting point, ° C. | Prepared as described in— |
|---|---|---|
| 22 | 203 | Monat, 36, 189 (1915). |
| 23 | 250 | J. Am. Chem. Soc., 76, 590. |
| 24 | 270 | Chem. Abstracts, 62, 62e (1955). |
| 26 | >300 | J. Am. Chem. Soc., 76, 590 (1954). |
| 27 | 276 | Ber., 64, 2390, (1931). |
| 28 | | Chem. Ber. 40, 2445 (1907). |
| 31 | >360 | Ann. d. Chem., 355, 349. |
| 32 | >350 | Chem. Ber., 64, 1232 (1931). |
| 34 | 215 | Ber., 72, 1246 (1939). |
| 41 | 162 | Ber., 72, 1255 (1939). |
| 43 | 265 | Albert, "The Acridines" published by Edward Arnold Co. (1951), page 18. |
| 44 | | J. Am. Chem. Soc., 76, 590 (1954). |
| 45 | | Albert, "The Acridines" published by Edward Arnold Co. (1951), page 18. |
| 46 | | J. Chem. Soc., 2840 (1931). |

Sensitizer 25 is available commercially.

Sensitizer 29 was prepared as follows. A mixture of 28 g. of 5-chloro-N-p-methoxyphenylanthranilic acid (Albert, p. 54), 14 g. potassium carbonate, 100 g. of iodobenzene, 75 ml. of nitrobenzene, and 1 g. of copper powder was refluxed four hours, the volatile components steam distilled, and the hot residue filtered. The filtrate was acidified with concentrated hydrochloric acid and the solid collected and dried to yield 28 g. of crude N-p-methoxyphenyl-N-phenyl-5-chloroanthranilic acid.

A solution of 7 g. of the crude acid in 25 ml. of phosphoryl chloride was refluxed one hour and poured onto water. The mixture was heated one hour on the steam bath and the orange solid collected and washed with water. The solid was recrystallized from ethoxyethanol and then from xylene to yield 0.5 g. of yellow-orange solid, M.P. 165–167° C.

| | C | H | N |
|---|---|---|---|
| Analysis: | | | |
| Calculated for $C_{19}H_{14}NO_2Cl$ | 71.6 | 4.2 | 4.2 |
| Found | 71.1 | 4.7 | 4.3 |

Sensitizer 30 was prepared by the same procedure used for Sensitizer 29 but in which 5-chloro-N-p-methoxymethylanthranilic acid was used.

Sensitizer 33 was prepared as follows. A mixture of 5 g. of 6,9-dichloro-2-methoxyacridine (Albert, p. 39) and 25 ml. of methyl sulfate was heated two hours on the steam bath. The mixture was cooled to room temperature, 100 ml. of water added, and the mixture extracted with chloroform several times. The chloroform extracts were extracted thoroughly with water and to the combined aqueous layers was added sodium thiosulfate until no more solid separated. The solid was collected, washed with water, and recrystallized from xylene to yield 1.5 g. of Sensitizer 33, M.P. 243–244° C.

| | C | H | N |
|---|---|---|---|
| Analysis: | | | |
| Calculated for $C_{15}H_{12}NOSCl$ | 62.3 | 4.2 | 4.8 |
| Found | 62.0 | 4.3 | 5.1 |

Sensitizer 35 was prepared as follows. A mixture of 1 g. of 3-methoxy-9-chloroacridine and 3 ml. of methyl sulfate were heated on a steam bath for one hour. After being cooled, the reaction mass was added to 50 ml. of ice water, and the resulting mixture extracted with ether. To the aqueous phase was added 3 g. of sodium thiosulfate, and after stirring for five minutes, an orange solid, Sensitizer 35, was collected by filtration and recrystallized from aqueous ethoxyethanol; M.P. 219–21° C.

Sensitizer 36 was prepared as follows. Twenty-six g. of 1-ethoxy-9-chloroacridine was added to 150 ml. of absolute alcohol, followed by the addition of 4 g. of thiourea. As soon as the thiourea was added, a bright yellow precipitate formed. The reaction mass was refluxed for four hours. After being cooled, the product, Sensitizer 36, was filtered and recrystallized from toluene: yield 16 g.; M.P. 171° C.

| | C | H |
|---|---|---|
| Analysis: | | |
| Calculated for $C_{15}H_{13}ONS$ | 70.6 | 5.1 |
| Found | 71.0 | 5.2 |

Sensitizer 37 was prepared by a process similar to that used for Sensitizer 36 in which 2-ethoxy-9-chloroacridine was used in place of the 1-ethoxy-9-chloroacridine. It had a M.P. of 209° C.

| | C | H |
|---|---|---|
| Analysis: | | |
| Calculated for $C_{15}H_{13}ONS$ | 70.6 | 5.1 |
| Found | 70.8 | 5.1 |

Sensitizer 38 was prepared as follows. A mixture of 4 g. of crude N-phenyl-N-o-tolylanthranilic acid (prepared from N-phenylanthranilic acid and o-iodotoluene) and 12 ml. of phosphoryl chloride was refluxed one hour, poured onto ice, and the solution filtered. A concentrated aqueous solution of sodium thiosulfate was added to the above filtrate until no more solid separated, and the brown solid was collected and recrystallized from xylene to yield 1 g. of the red colored Sensitizer 38, M.P. 216–217° C.

| | C | H | N |
|---|---|---|---|
| Analysis: | | | |
| Calculated for $C_{20}H_{14}NS$ | 79.8 | 5.0 | 4.9 |
| Found | 80.8 | 5.1 | 4.9 |

Sensitizer 39 was prepared by a process similar to that used for Sensitizer 36, in which 1,2-benz-9-chloroacridine was used in place of 9-chloro-3-ethoxyacridine. This sensitizer had a M.P. of 306° C.

| | C | H |
|---|---|---|
| Analysis: | | |
| Calculated for $C_{17}H_{9}NS$ | 78.0 | 3.6 |
| Found | 78.1 | 4.6 |

Sensitizer 40 was prepared as follows. A mixture of 5 g. of thioacridone, 2.5 g. of potassium hydroxide, and 25. ml. of ethanol was heated until a clear solution resulted, and the alcohol was removed in vacuo. To the residue was added 5 g. of p-nitrobromobenzene in 25 ml. of trichlorobenzene and the mixture was refluxed for six hours, the solvent removed by steam distillation and the solid collected from the filtrate. The solid was recrystallized twice from ethanol, then mixed with 20 ml. of phosphoryl chloride, refluxed one hour, and poured onto 200 g. of chopped ice. The mixture was filtered, 4 g. of solid sodium thiosulfate was added to the filtrate, and the solid collected and recrystallized from aqueous ethoxyethanol to give about 1 g. of Sensitizer 40 with a M.P. of 310–312° C.

| | C | H |
|---|---|---|
| Analysis: | | |
| Calculated for $C_{19}H_{14}N_2S$ | 75.6 | 4.6 |
| Found | 76.1 | 4.5 |

Sensitizer 42 was prepared by a process similar to that used to make Sensitizer 37 but in which 9-chloro-4-ethoxyacridine was used in place of 9-chloro-2-ethoxyacridine.

Our invention is further illustrated by the accompanying drawings, FIGS. 1, 2, 3, 4, 5, and 6, which show typical spectrograms.

Figure 1:
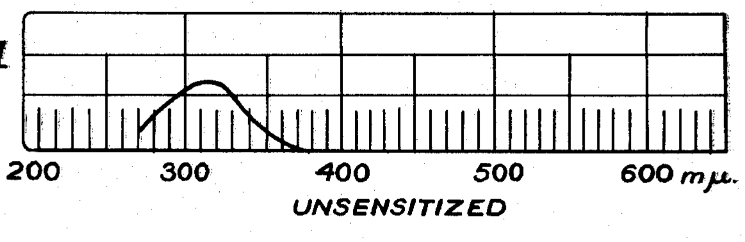
FIG. 1 is a spectrogram made of a coating of unsensitized poly(vinyl acetate-3-(4)-azidophthalate).
Figure 2:
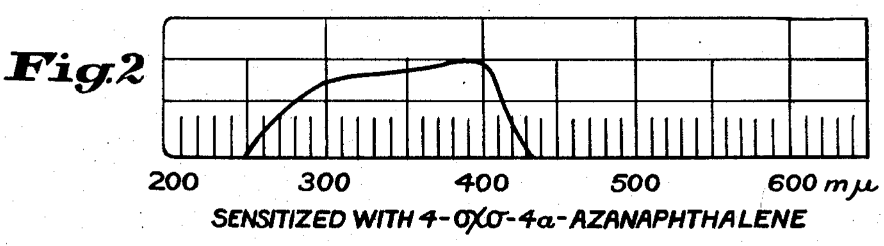
FIG. 2 is the spectrogram made in Example III of a coating of poly(vinyl acetate-3-(4)-azidophthalate) that was sensitized with our Sensitizer 10.
Figure 3:
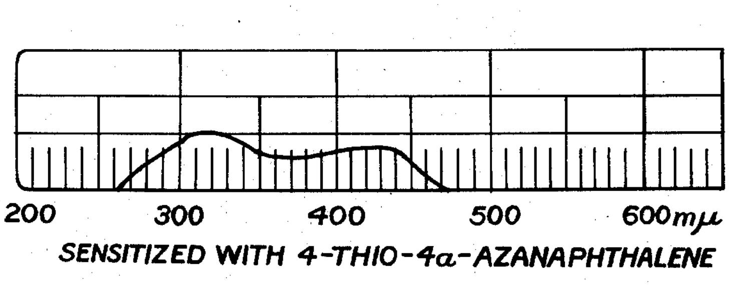
FIG. 3 is a spectogram made of a coating of poly(vinyl acetate-3-(4)-azidophthalate) that was sensitized with our Sensitizer 15.
Figure 4:
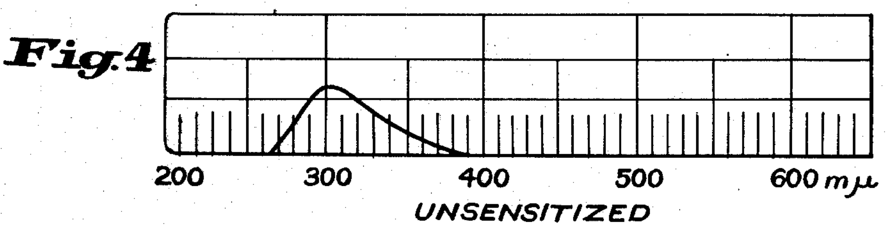
FIG. 4 is a spectrogram made of a coaitng of unsensitized poly(vinyl acetate-azidobenzoate).
Figure 5:
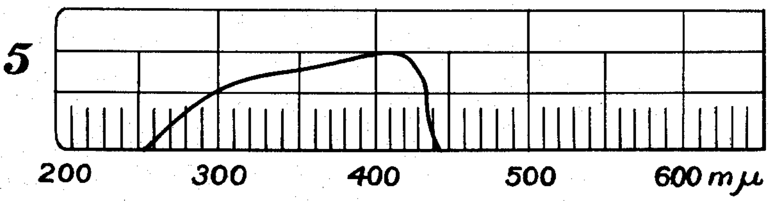
FIG. 5 is a spectogram made of poly(vinyl acetate-azidobenzoate) sensitized with Sensitizer 10.
Figure 6:
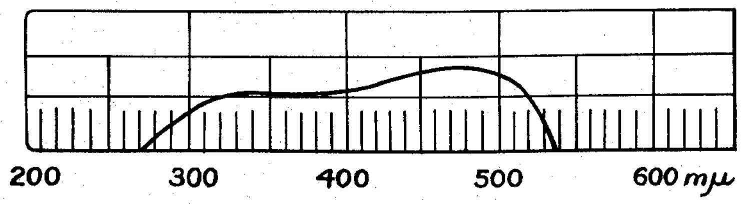
FIG. 6 is a spectrogram made of poly(vinyl acetate-azidobenzoate) sensitized with Sensitizer 34.

The sensitizing agents of our invention are valuable optical sensitizers for polymers containing recurring aromatic azide groups. Our photoresists comprising these polymers sensitized with our sensitizers are characterized by having greatly increased speeds and longer spectral ranges of sensitivity than are obtainable with the unsensitized polymers. For example, our photoresists have relative speeds as high as 2200 compared to 45 for the unsensitized polymers, and spectral ranges of sensitivity that are as high as 280 to 590 m$\mu$ compared to 280 to 380 m$\mu$ for the unsensitized polymer. The greatly increased sensitivity particularly in the longer wave length regions of the spectrum shown by our photoresist compositions make it possible to use incandescent light sources for exposing this material where previously powerful arc lights were required. These valuable characteristic also give the user of our photoresist a material that can be projection printed so that enlargements or reductions can be readily made of an original subject.

The invention has been described in detail with particular reference to preferred embodiments thereof but it will be understood that variations and modifications can be effected within the spirit and scope of the invention as described hereinabove and as defined in the appended claims.

We claim:

1. A light-sensitive photoresist composition comprising a mixture of a polymer containing recurring aromatic azide groups and as a sensitizing agent a compound selected from those having the three formulas:

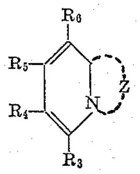

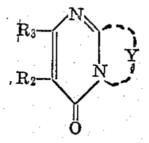

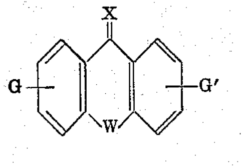

in which $R_2$, $R_3$, $R_4$, $R_5$, and $R_6$ each represents a member selected from the class consisting of a hydrogen atom, a lower alkyl group having one to four carbon atoms, a carbalkoxy group in which the alkoxy moiety has one to four carbon atoms, and a halogen atom, Z represents the nonmetallic atoms required to complete a nucleus selected from the class consisting of a 4-ozo-1,4a-diazanaphthalene nucleus, a 4-oxo-4a-azanaphthalene nucleus, and a 4-thio-4a-azanaphthalene nucleus, Y represents the nonmetallic atoms required to complete a 1-thia-3a,7-diazaindene nucleus, X represents a member selected from the class consisting of a sulfur atom and an oxygen atom, W represents a member selected from the class consisting of a $=NQ$ group and a $=CH_2$ group, Q represents a member selected from the class consisting of a hydrogen atom, an alkyl group having one to four carbon atoms, an alkoxy group having from one to four carbon atoms, an aryl group, and an aryloxy group, and G and G' each represents a member selected from the class consisting of a Q group and a fused carbocyclic ring.

2. A light-sensitive photoresist composition comprising a mixture of a polymer containing recurring aromatic azide groups and as a sensitizing agent a compound selected from the class consisting of (1) a 4-oxo-1,4a-diazanaphthalene, (2) a 4a-azanaphthalene, (3) a 4-oxo-1-thia-3a,7-diazaindene, (4) an acridone, and (5) a thioacridone.

3. A light-sensitive photoresist composition comprising a polymer containing recurring aromatic azide groups and as a sensitizer a compound selected from those having the formula:

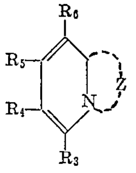

in which $R_3$, $R_4$, $R_5$, and $R_6$ each represents a member selected from the class consisting of a hydrogen atom, a lower alkyl group having one to four carbon atoms, a carbalkoxy group in which the alkoxy moiety has one to four carbon atoms, and a halogen atom, and Z represents the nonmetallic atoms required to complete a nucleus selected from the class consisting of a 4-oxo-1,4a-diazanaphthalene nucleus, a 4-oxo-4a-azanaphthalene nucleus and a 4-thio-4a-azanaphthalene nucleus.

4. A light-sensitive photoresist composition comprising a polymer containing recurring aromatic azide groups and as a sensitizer a compound selected from those having the formula:

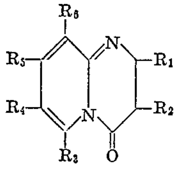

in which $R_1$, $R_2$, $R_3$, $R_4$, $R_5$, and $R_6$ each represents a member selected from the class consisting of a hydrogen atom, a lower alkyl group having one to four carbon atoms, a carbalkoxy group in which the alkoxy moiety has one to four carbon atoms and a halogen atom.

5. A light-sensitive photoresist composition comprising a polymer containing recurring aromatic azide groups and as a sensitizer a compound selected from those having the formula:

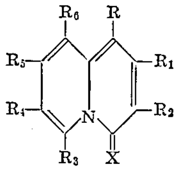

in which R, $R_1$, $R_2$, $R_3$, $R_4$, $R_5$, and $R_6$ each represents a member selected from the class consisting of a hydrogen atom, a lower alkyl group having one to four carbon atoms, a carbalkoxy group in which the alkoxy moiety has one to four carbon atoms, and a halogen atom, and X is a member selected from the class consisting of an oxygen atom and a sulfur atom.

6. A light-sensitive photoresist composition comprising a polymer containing recurring aromatic azide groups and as a sensitizer a compound selected from those having the formula:

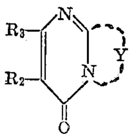

in which $R_2$ and $R_3$ each represents a member selected from the class consisting of a hydrogen atom, a lower alkyl group having one to four carbon atoms, a carbalkoxy group in which the alkoxy moiety has one to four carbons, and a halogen atom, and Y represents the nonmetallic atoms required to complete a 1-thia-3a,7-diazaindene nucleus.

7. A light-sensitive photoresist composition comprising a polymer containing recurring aromatic azide groups and as a sensitizer a compound selected from those having the formula:

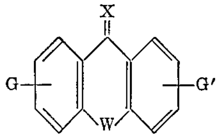

in which X represents a member selected from the class consisting of an oxygen atom and a sulfur atom, W represents a member selected from the class consisting of a $=NQ$ group and a $=CH_2$ group, Q represents a member selected from the class consisting of a hydrogen atom, a lower alkyl group having one to four carbon atoms, an alkoxy group having one to four carbon atoms, an aryl group, and an aryloxy group, and G and G′ each represents a member selected from the class consisting of a Q group and the nonmetallic atoms required to complete a fused carbocyclic ring.

8. A light-sensitive photoresist composition comprising a mixture of a polymer containing recurring aromatic azide groups and a sensitizing amount of 4-oxo-4a-azanaphthalene.

9. A light-sensitive photoresist composition comprising a mixture of the polymer poly(vinyl acetate-3-(4)-azidophthalate) and a sensitizing quantity of 4-oxo-4a-azanaphthalene.

10. A light-sensitive photoresist composition comprising a mixture of the polymer poly(vinyl acetate-azidobenzoate) and a sensitizing quantity of 4-oxo-4a-azanaphthalene.

11. A light-sensitive photoresist composition comprising a mixture of a polymer containing recurring aromatic azide groups and a sensitizing amount of 3-carbethoxy-6-chloro-4-oxo-1,4a-diazanaphthalene.

12. A light-sensitive photoresist composition comprising a mixture of a polymer containing recurring aromatic azide groups and a sensitizing amount of 6-chloro-2-methoxy-10-phenylacridone.

13. A light-sensitive photoresist composition comprising a mixture of a polymer containing recurring aromatic azide groups and a sensitizing amount of 6-chloro-2-methoxy-10-methylthioacridone.

14. A light-sensitive photoresist composition comprising a mixture of poly(vinyl acetate-3-(4)-azidophthalate) and a sensitizing amount of 6-chloro-2-methoxy-10-methylthioacridone.

15. A light-sensitive photoresist composition comprising a mixture of poly(vinyl acetate-azidobenzoate) and a sensitizing amount of 6-chloro-2-methoxy-10-methylthioacridone.

16. A light-sensitive photoresist composition comprising a mixture of acetal of partially acetylated poly(vinyl alcohol) and p-azidobenzaldehyde, and a sensitizing amount of 6-chloro-2-methoxy-10-methyl thioacridone.

17. A light-sensitive photoresist composition comprising a mixture of a polymer containing recurring aromatic azide groups and a sensitizing amount of 3-methoxy-10-methyl-9-thioacridone.

18. A light-sensitive photoresist composition comprising a mixture of poly(vinyl acetate-3-(4)-azidophthalate)

and a sensitizing amount of 3-methoxy-10-methyl-9-thioacridone.

19. A light-sensitive photoresist composition comprising a mixture of poly(vinyl acetate-azidobenzoate) and a sensitizing amount of 3-methoxy-10-methyl-9-thioacridone.

20. A light-sensitive photoresist composition comprising a mixture of acetal of partially acetylated poly(vinyl alcohol) and p-azidobenzaldehyde and a sensitizing amount of 3-methoxy-10-methyl-9-thioacridone.

References Cited in the file of this patent

UNITED STATES PATENTS

| | | |
|---|---|---|
| 2,464,780 | Anish | Mar. 22, 1949 |
| 2,948,610 | Merrill et al. | Aug. 9, 1960 |
| 2,980,535 | Schroeter | Apr. 18, 1961 |

FOREIGN PATENTS

| | | |
|---|---|---|
| 843,543 | Great Britain | Aug. 4, 1960 |